United States Patent [19]
New

[11] Patent Number: 6,057,708
[45] Date of Patent: May 2, 2000

[54] FIELD PROGRAMMABLE GATE ARRAY HAVING A DEDICATED INTERNAL BUS SYSTEM

[75] Inventor: Bernard J. New, Los Gatos, Calif.

[73] Assignee: Xilinx, Inc., San Jose, Calif.

[21] Appl. No.: 08/902,375

[22] Filed: Jul. 29, 1997

[51] Int. Cl.[7] .................................................. H03K 19/177
[52] U.S. Cl. .............................. 326/41; 326/39; 326/101
[58] Field of Search ................................. 326/39, 41, 37, 326/47, 101

[56] References Cited

U.S. PATENT DOCUMENTS

| | | | |
|---|---|---|---|
| 4,772,811 | 9/1988 | Fujioka et al. | 326/41 |
| 4,969,121 | 11/1990 | Chan et al. | 326/39 |
| 5,371,422 | 12/1994 | Patel et al. | 326/39 |
| 5,644,496 | 7/1997 | Agrawal et al. | 326/41 |
| 5,825,202 | 10/1998 | Tavana et al | 326/41 |

OTHER PUBLICATIONS

Xilinx 1994. Data Book entitled "The Programmable Logic Data Book", available from Xilinx, Inc., 2100 Logic Drive, San Jose, California 95124, pp. 2–7 through 2–45.

Tom Shanley/Don Anderson, Mindshare, Inc., entitled "PCI System Architecture" Third Edition, PC System Architecture Series, published by Addison–Wesley Publishing Company, Copyright 1995 by Mindshare, Inc., pp. 19–35.

*Primary Examiner*—Jon Santamauro
*Attorney, Agent, or Firm*—E. Eric Hoffman; Bever & Hoffman; Edel M. Young

[57] ABSTRACT

A user-defined logic device, such as a field programmable gate array (FPGA), having a dedicated internal bus, a plurality of dedicated bus interface circuits, and a programmable logic array. The dedicated bus interface circuits are connected in parallel to the dedicated internal bus. The programmable logic array is programmable to implement one or more functions. The programmable logic array is coupled to the dedicated bus interface circuits, such that each function is coupled to a corresponding bus interface circuit. The functions can communicate with one another through the bus interface circuits and internal bus, or through communication pathways located within the programmable logic array. In addition, the functions can communicate with devices external to the user-defined logic device through a bus bridge circuit which is coupled to the dedicated internal bus, or directly through the pins of the user-defined logic device.

15 Claims, 3 Drawing Sheets

FIELD PROGRAMMABLE GATE ARRAY HAVING A DEDICATED INTERNAL BUS SYSTEM

FIELD OF THE INVENTION

The present invention relates to a field programmable gate array (FPGA) architecture. More specifically, the present invention relates an FPGA which may be coupled to a standard external bus system.

BACKGROUND OF THE INVENTION

As semiconductor technology provides end-user access to even larger amounts of user-defined logic (e.g., programmable logic devices, field programmable gate arrays, or gate arrays), it has become desirable to integrate multiple disjoint functions onto a single chip. This trend has, in turn, created a need for on-chip communications among these functions. It is therefore desirable to have a user-defined logic device which enables multiple disjoint functions to be implemented on a single chip, while facilitating on-chip communication among these various functions. It is also desirable for the user-defined logic device to provide an interface to a standard external bus system.

One type of user-defined logic device is a field programmable gate array (FPGA). Conventional FPGAs include circuitry which is initially programmed (or configured) in response to an externally provided stream of data values which is commonly referred to as a configuration data stream or bitstream. The programmable circuitry typically includes a plurality of configurable logic blocks (CLBs) and programmable interconnect circuitry, which will hereinafter be collectively referred to as a programmable logic array.

The programmable logic array can be programmed to implement a bus interface circuit and a function in response to the configuration data stream. Such a bus interface circuit enables the function to be operably coupled to a conventional external bus, such as a PCI bus. However, a significant portion of the FPGA's resources are required to create the bus interface circuit. For example, more than 40 percent of the CLBs of a typical FPGA may be required to create a bus interface circuit. It would therefore be desirable to have an FPGA architecture which is capable of operating from a conventional external bus, without requiring a substantial portion of the programmable logic array to establish a bus interface circuit.

SUMMARY

Accordingly, the present invention provides a user-defined logic device, such as a field programmable gate array (FPGA), which has a dedicated internal bus, a plurality of dedicated bus interface circuits, and a programmable logic array. In a particular embodiment, the dedicated internal bus extends around the periphery of the user-defined logic device. The dedicated bus interface circuits are connected in parallel to the dedicated internal bus. The dedicated internal bus and bus interface circuits advantageously provide a greater logic density and higher performance than equivalent elements implemented using programmable logic.

The programmable logic array is coupled to the dedicated bus interface circuits. The programmable logic array is programmable to implement one or more functions, with each function being coupled to a corresponding bus interface circuit. The functions implemented by the programmable logic array can communicate with one another via the bus interface circuits and internal bus. Alternatively, the functions can communicate with one another through communication pathways which are located within the programmable logic array. A user-defined logic device in accordance with the present invention thereby facilitates on-chip communication between disjoint functions implemented by the programmable logic array.

The functions implemented by the programmable logic array can communicate with devices external to the user-defined logic device through a bus bridge circuit. The bus bridge circuit is coupled between the dedicated internal bus and selected pins of the user-defined logic device. Alternatively, the functions can communicate with an external device via a direct connection between the functions and the pins of the user-defined logic device. Such a direct connection is provided by programmable interconnect circuitry of the user-defined logic device which is separate from the bus interface circuits and internal bus.

The present invention will be more fully understood in view of the following detailed description taken together with the drawings.

DETAILED DESCRIPTION

Figure 1:
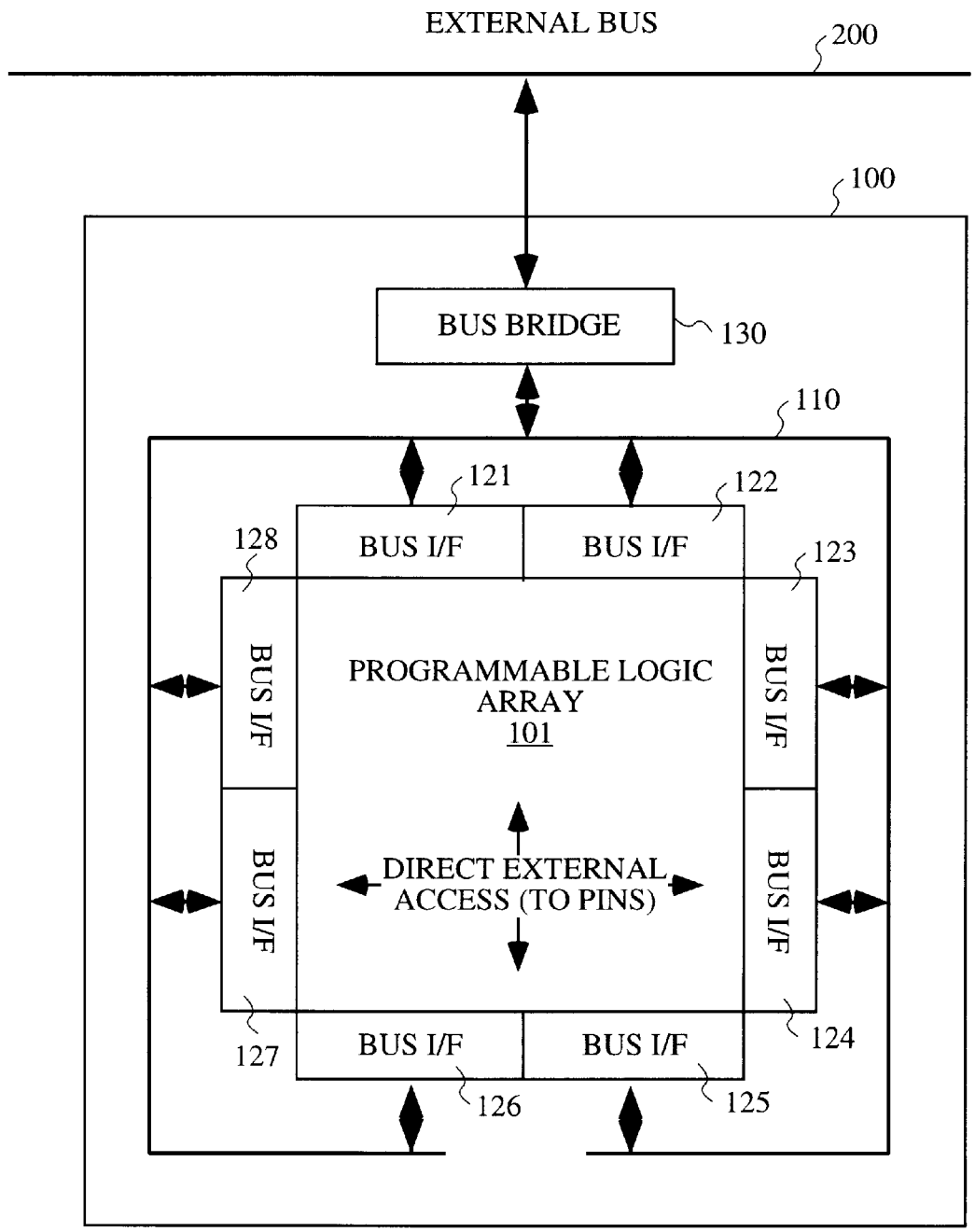
FIG. 1 is a block diagram of a user-defined logic device in accordance with one embodiment of the invention.

FIG. 1 is a block diagram of a user-defined logic device 100 in accordance with one embodiment of the invention. Although the user-defined logic device 100 is described as being a field programmable gate array (FPGA), the present invention is applicable to other user-defined logic devices, such as sum-of-products programmable logic devices or mask programmed gate arrays. The FPGA 100 includes a user-definable programmable logic array 101, a prefabricated internal bus 110, a plurality of bus interface circuits 121–128, and a bus bridge circuit 130.

The programmable logic array 101 is implemented, for example, with a RAM-based, EPROM-based, anti-fuse-based, or mask-programmable technology. In the described embodiment, the programmable logic array 101 includes an array of configurable logic blocks (CLBs) (not shown), as well as programmable interconnect circuitry for selectively coupling the CLBs. The programmable logic array 101 can be programmed to implement various functions. As described in more detail below, each of these functions can be coupled to a corresponding one of the bus interface circuits 121–128, or to pins of the FPGA 100. The programmable logic array 101 can be programmed in response to a conventional configuration data stream provided to the FPGA 100.

The programmable logic array 101 can be accessed in two different manners. First, the programmable logic array 101 can be directly accessed via conventional interconnection resources located between the pins of the FPGA 100 (not shown) and the programmable logic array 101. These conventional interconnection resources can include, for example, user-configurable input/output blocks (IOBs) and routing resources which include single-length lines, double-length lines and longlines, and programmable interconnects. These interconnection resources, as well as the CLBs, are described in more detail in "The Programmable Logic Data Book" pp. 2–7 to 2–45, (© 1994), available from Xilinx, Inc., 2100 Logic Drive, San Jose, Calif. 95124, which is hereby incorporated by reference.

These conventional interconnection resources permit functions which are implemented by the programmable logic array 101 to be directly connected to the physical entities that these functions control or drive. For example, if the programmable logic array 101 is configured to implement a disk controller function, then the conventional interconnection resources would allow the disk controller function to be directly connected to the disk drive which the disk controller function controls.

The programmable logic array 101 can also be accessed via the bus interface circuits 121–128, the dedicated internal bus 110 and the bus bridge circuit 130. The bus bridge circuit 130 is adapted to be connected directly to an external bus 200. External bus 200 can be any type of conventional bus. For example, external bus 200 can be a standard PCI bus such as described by Tom Shanley and Don Anderson at pages 19–35 of "PCI System Architecture" published by Addison-Wesley, © 1995 by Mindshare, Inc. The bus bridge circuit 130 includes a plurality of dedicated pins which facilitate connection to the external bus 200. The bus bridge circuit 130 further includes circuitry which permits the functions implemented by the programmable logic array 101 to communicate with other external functions (e.g., other FPGAs or microprocessors) which are connected to the external bus 200.

The bus bridge circuit 130 is connected to the dedicated internal bus 110. The dedicated internal bus 110 has the same characteristics as the external bus 200. Thus, if external bus 200 is a PCI bus, then internal bus 110 is also a PCI bus. The internal bus 110 extends around the periphery of the FPGA 100. The bus interface circuits 121–128 are connected in parallel to the internal bus 110. In the described embodiment, the prefabricated bus interface circuits 121–128 are distributed around the periphery of the programmable logic array 101. In an alternative embodiment, the bus interface circuits 121–128 are distributed throughout the programmable logic array 101. The bus interface circuits 121–128 provide interfaces between the functions implemented in the programmable logic array 101 and the internal bus 110. Because the bus interface circuits 121–128 are implemented with dedicated circuitry, the logic density of the bus interface circuits 121–128 is much greater than would otherwise be realized if the bus interface circuits 121–128 were implemented by the programmable logic array 101.

Figure 2:
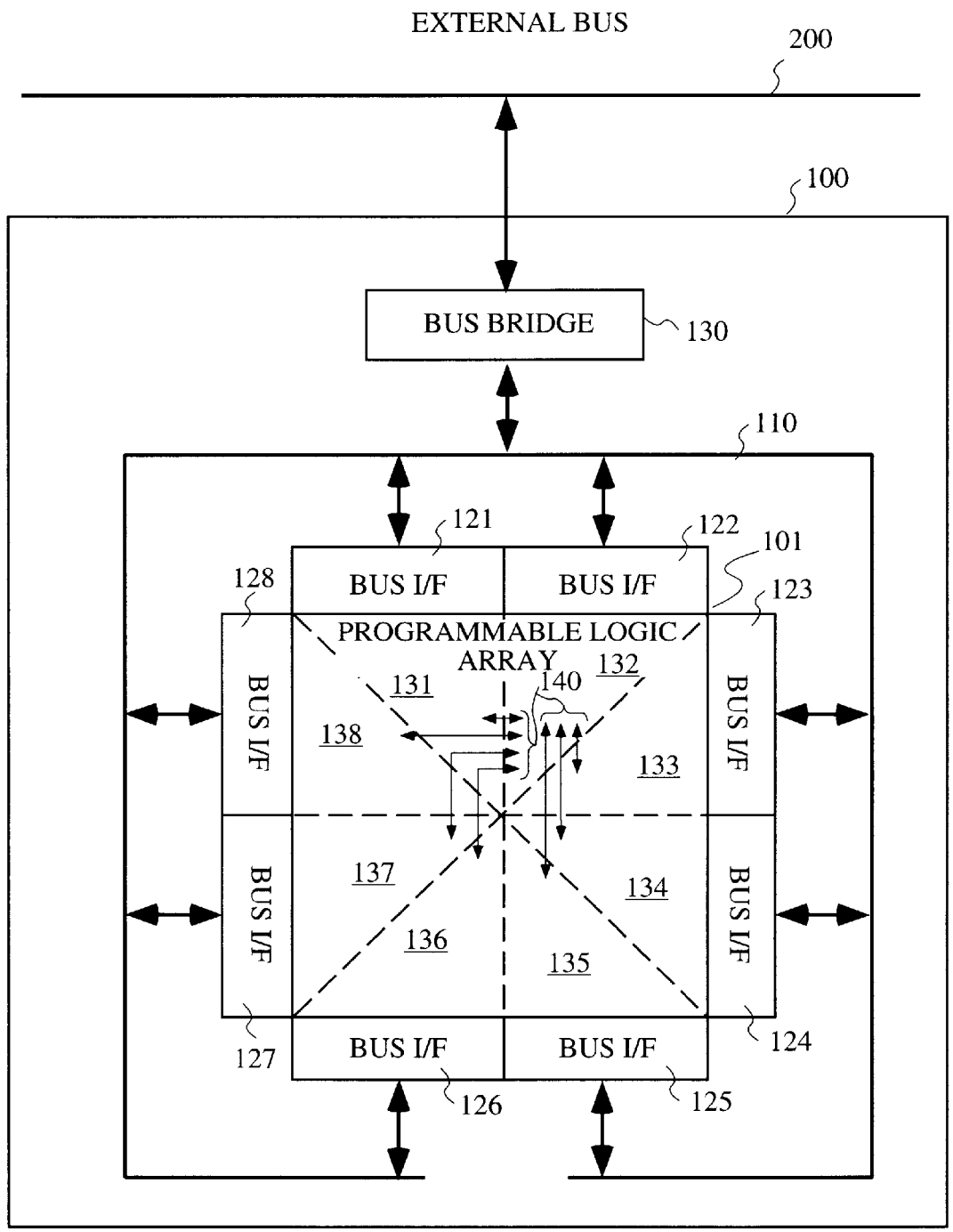
FIG. 2 is a block diagram which illustrates the boundaries of dedicated programmable regions within the logic device of FIG. 1 in accordance with one embodiment.

FIG. 2 schematically illustrates the physical division of the programmable logic array 101 in accordance with one embodiment of the invention. In this embodiment, dedicated programmable regions 131–138 of the programmable logic array 101 are associated with corresponding bus interface circuits 121–128. Although each of the regions 131–138 is shown as having the same size, this is not necessary. In a variation of the illustrated embodiment, the regions 131–138 can have different predetermined sizes, thereby facilitating the formation of both small and large functions.

Each of the regions 131–138 can be individually programmed to implement a different function. The functions implemented by regions 131–138 can communicate in two different manners. First, these functions can communicate across the boundaries of regions 131–138 via communication pathways located within the programmable logic array 101. For example, the function implemented by region 132 can communicate with the functions implemented by any of regions 131 or 133–138 via internal communication pathways 140. Other communication pathways (not shown) can be provided to facilitate direct communication between any of the functions implemented by regions 131–138.

In addition, the functions implemented by regions 131–138 can communicate via corresponding bus interface circuits 121–128 and internal bus 110. For example, the function implemented by region 136 can communicate with the function implemented by region 135 through corresponding bus interface circuits 126 and 125 and the internal bus 110.

Figure 3:
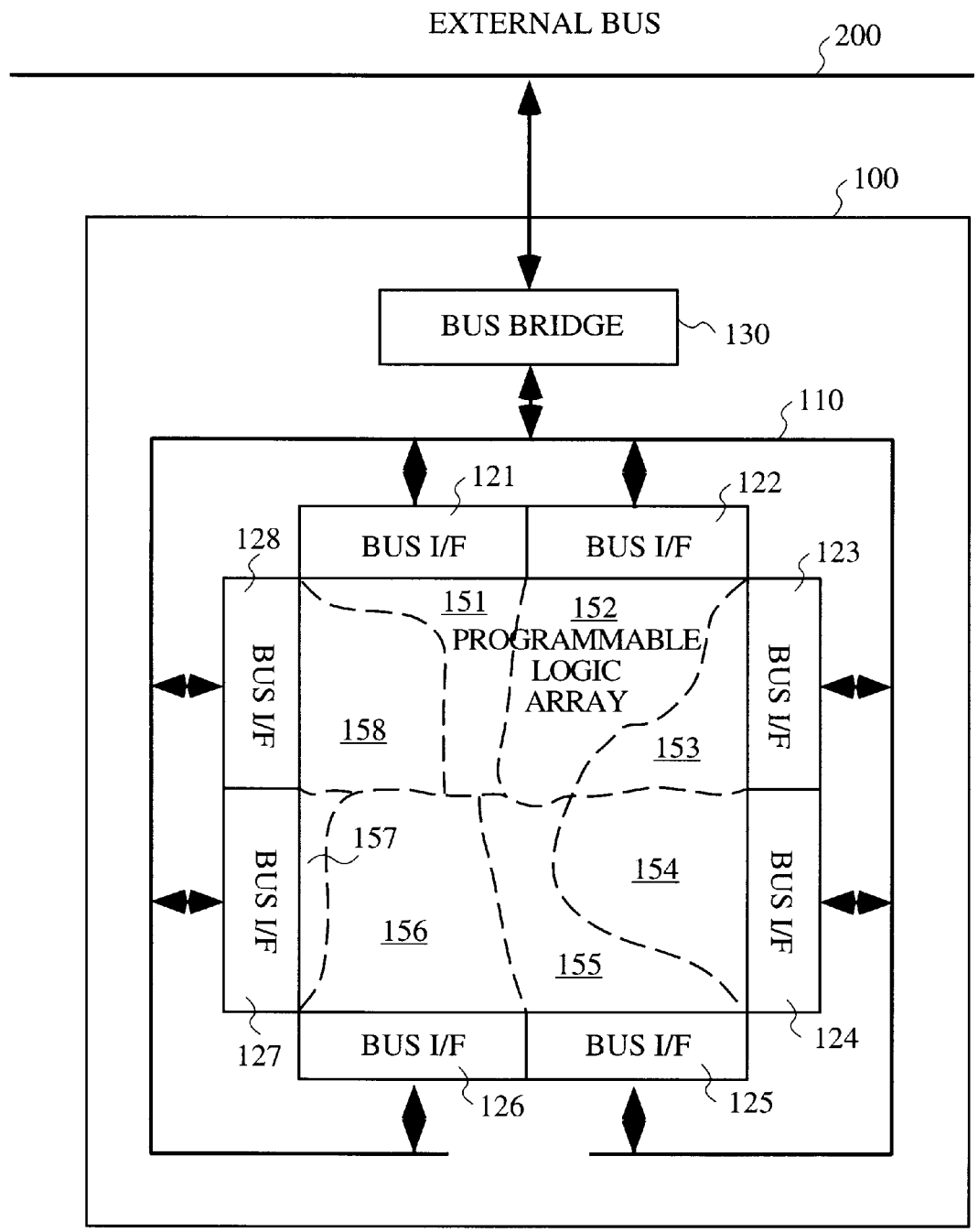
FIG. 3 is a block diagram which illustrates the variable boundaries of non-dedicated programmable regions within the logic device of FIG. 1 in accordance with another embodiment of the invention.

FIG. 3 schematically illustrates non-dedicated programmable regions 151–158 of the programmable logic array 101 in accordance with an alternative embodiment of the invention. In this embodiment, the sizes of the programmable regions 151–158 are variable. Thus, regions 151–158 can be programmed to have different sizes, depending upon the amount of logic required to implement the desired function. In the illustrated embodiment, region 157 is smaller (and therefore includes less programmable logic) than region 152. By allowing for regions having different, programmable sizes, the logic resources within programmable logic array 101 can be allocated more efficiently. Again, the functions implemented by regions 151–158 can communicate via communication pathways within the programmable logic array 101 or via the bus interface circuits 121–128 and the internal bus 110.

Although FIGS. 2 and 3 indicate that there is a one-to-one correspondence between the physical regions within the programmable logic array 101 and the bus interface circuits 121–128, this is not necessary. Thus, the entire programmable logic array 101 can be programmed to implement a single function, with only one of the bus interface circuits 121–128 being active to provide an interface between this single function and the internal bus 110. Similarly, the programmable logic array 101 can be programmed to implement two functions, with only two of the bus interface circuits 121–128 being active to provide an interface between these two functions and the internal bus 110. Moreover, the programmable logic array 101 can be programmed to implement two or more functions, with one of the functions being accessed through a bus interface circuit and the internal bus 110, and another function being accessed directly through programmable interconnect circuitry.

The benefits offered by FPGA 100 include the following. Because dedicated bus interface circuits 121–128 are provided for each function, each function does not have to duplicate the logic required to implement the bus interface circuits. Additionally, the software task of implementing the functions in the programmable logic array 101 is simplified because the software does not need to implement the dedicated bus 110, the bus interfaces 121–128 or the bus bridge circuit 130. Moreover, the prefabricated bus 110, bus interface circuits 121–128 and bus bridge circuit 130 are advantageously smaller and faster than equivalent structures implemented in programmable logic.

Although the invention has been described in connection with several embodiments, it is understood that this invention is not limited to the embodiments disclosed, but is capable of various modifications which would be apparent to one of ordinary skill in the art. For example, although the described FPGAs were described as having particular numbers of bus interface circuits and regions within the programmable logic arrays, other numbers of these elements are contemplated and considered within the scope of the invention. Moreover, although the present invention is described in connection with an FPGA, it is understood that the principles of the present invention can also be applied to other user-defined logic devices, such as programmable logic devices and gate arrays. Thus, the invention is limited only by the following claims.

I claim:

1. A field programmable gate array (FPGA) fabricated on a substrate, the FPGA comprising:
    a dedicated internal bus;
    a plurality of dedicated bus interface circuits coupled in parallel to the dedicated internal bus;
    a programmable logic array having an array of configurable logic blocks (CLBs) and programmable interconnect circuitry, the CLBs being programmable to implement one or more functions, the programmable logic array being coupled to the dedicated bus interface circuits, such that the programmable interconnect circuitry makes direct connections available between each of the bus interface circuits and each of the CLBs.

2. The FPGA of claim 1, further comprising a bus bridge circuit coupled to the dedicated internal bus, wherein the bus bridge circuit enables the FPGA to be coupled to an external bus.

3. The FPGA of claim 1, wherein the dedicated internal bus extends around the periphery of the substrate.

4. The FPGA of claim 1, further comprising programmable interconnect circuitry for connecting the programmable logic array directly to an external device.

5. The FPGA of claim 1, wherein the dedicated bus interface circuits are disposed around the programmable logic array.

6. The FPGA of claim 1, wherein each of the CLBs comprise a plurality of function generators.

7. The FPGA of claim 1, wherein the programmable logic array comprises a predetermined number of dedicated programmable regions, wherein each of the programmable regions is programmable for implementing a function.

8. The FPGA of claim 7, wherein each of the programmable regions has the same size.

9. The FPGA of claim 7, wherein the programmable regions have different sizes.

10. The FPGA of claim 1, wherein the programmable logic array comprises a variable number of programmable regions, wherein each of the programmable regions is programmable for implementing a function.

11. The FPGA of claim 10, wherein the size of each of the programmable regions is programmable.

12. The FPGA of claim 1, wherein the programmable logic array comprises communication pathways for enabling communication between the functions.

13. The FPGA of claim 1, wherein there is a one-to-one correspondence between the bus interface circuits and the functions.

14. The FPGA of claim 1, wherein there are more bus interface circuits than functions.

15. A method of configuring a field programmable gate array (FPGA), the method comprising the steps of:
    providing a dedicated internal bus on the logic device;
    providing a plurality of dedicated bus interface circuits on the logic device, the bus interface circuits being connected in parallel to the internal bus;
    programming a programmable logic array having an array of configurable logic blocks (CLBs) and programmable interconnect circuitry to implement one or more functions; and
    coupling the programmable logic array to the bus interface circuits, wherein the programmable interconnect circuitry makes direct connections available between each of the bus interface circuits and each of the CLBs.

* * * * *